United States Patent [19]

Papaliolios

[11] Patent Number: 5,218,566
[45] Date of Patent: Jun. 8, 1993

[54] DYNAMIC ADJUSTING REFERENCE VOLTAGE FOR FERROELECTRIC CIRCUITS

[75] Inventor: Andreas G. Papaliolios, Sunnyvale, Calif.

[73] Assignee: National Semiconductor Corporation, Santa Clara, Calif.

[21] Appl. No.: 745,428

[22] Filed: Aug. 15, 1991

[51] Int. Cl.⁵ .............................................. G11C 11/22
[52] U.S. Cl. .................................... 365/145; 365/149
[58] Field of Search ............................ 365/145, 149; 307/296.1, 296.8, 264

[56]  References Cited

U.S. PATENT DOCUMENTS

| | | | |
|---|---|---|---|
| 3,466,618 | 9/1969 | Bartlett et al. | 340/173.2 |
| 3,579,208 | 5/1971 | Bartlett | 340/173.2 |
| 3,599,185 | 8/1971 | Bartlett et al. | 340/173.2 |
| 4,162,402 | 7/1979 | Hopper | 250/332 |
| 4,853,893 | 8/1989 | Eaton, Jr. et al. | 365/145 |
| 4,873,664 | 10/1989 | Eaton, Jr. | 365/145 |
| 4,888,733 | 12/1989 | Mobley | 365/145 |
| 4,910,708 | 3/1990 | Eaton, Jr. et al. | 365/145 |
| 4,974,204 | 11/1990 | Miller | 365/145 |

Primary Examiner—Eugene R. LaRoche
Assistant Examiner—Son Dinh
Attorney, Agent, or Firm—Richards, Medlock & Andrews

[57]  ABSTRACT

A reference voltage circuit used for determining the polarization state of a ferroelectric capacitor. The circuit includes a pair of ferroelectric capacitors, each polarized to an opposite polarization state. The charge stored in each ferroelectric capacitor is discharged into respective sense capacitors, thereby generating different voltages, each representative of the different polarization states. The sense capacitors are then short circuited together to thereby average the representative voltages and provide a reference voltage that is of intermediate value. The reference voltage can then the used to compare memory cell signals generated by other ferroelectric capacitors to determine the respective polarization states.

30 Claims, 3 Drawing Sheets

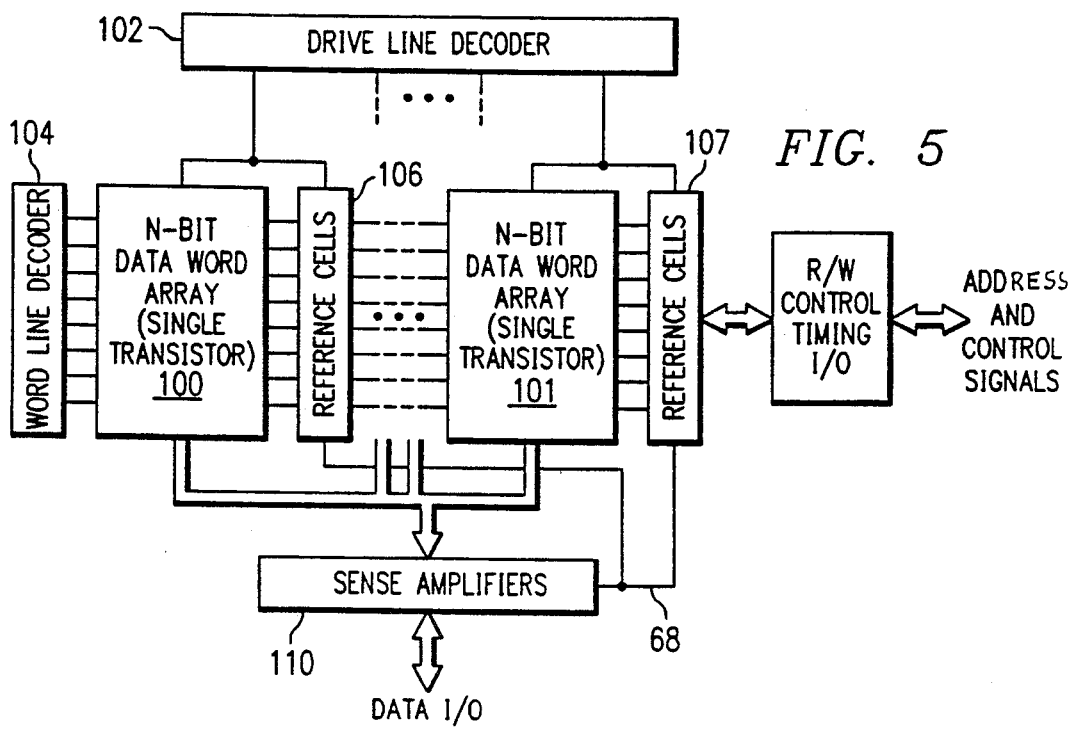
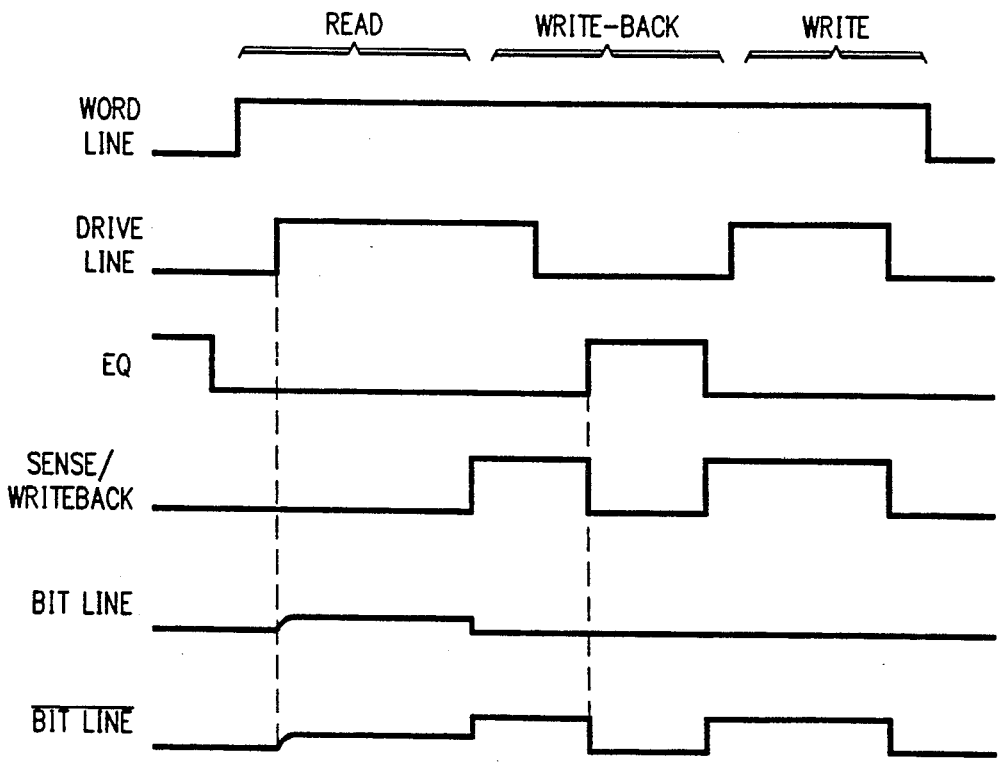

DYNAMIC ADJUSTING REFERENCE VOLTAGE FOR FERROELECTRIC CIRCUITS

TECHNICAL FIELD

The present invention relates in general to ferroelectric circuits, and more particularly relates to reference voltage generation circuits utilized in ferroelectric circuits for determining the polarization state of a ferroelectric component.

BACKGROUND OF THE INVENTION

The unique characteristics of ferroelectric materials have been known for many years. The development of ferroelectric components, especially capacitors, has experienced a renewed interest because its ability to store in a nonvolatile manner polarization states corresponding to binary values. With this capability, ferroelectric capacitors have been developed for use in digital integrated circuits. Indeed, the hysteresis characteristic of a ferroelectric capacitor lends itself well as the storage mechanism in nonvolatile memory cells.

In order to fully utilize the properties of ferroelectric components, it is necessary to determine the polarization state previously stored in the component. When the ferroelectric material is utilized as a dielectric in fabricating a capacitor, the effective capacitance is different, depending on whether the capacitor is polarized in one direction or the other. With this inherent characteristic, a ferroelectric capacitor can be discharged so that a voltage of one magnitude is developed if the ferroelectric capacitor were polarized in one direction, and a voltage of a different magnitude is developed if the ferroelectric capacitor were polarized in the opposite direction. The voltage developed as a result of the discharge of the ferroelectric capacitor can then be compared with a reference to determine the polarization state of the capacitor. When employed in connection with single-transistor, single-capacitor ferroelectric memory cells, such type of polarization state determination is known as single-ended sensing.

The traditional problem with single-ended sensing of the polarization state of ferroelectric capacitors is that the electrical charge discharged or read from a ferroelectric capacitor incurs short-term and long-term changes. Short-term changes in the characteristics of a ferroelectric capacitor occur when a cell is written a first time, and then immediately thereafter before the polarization state has settled back to a quiescent magnitude. As a result, an electrical charge discharged from the capacitor during both write operations is different, even when the polarization state remains the same. Long-term changes in the ferroelectric capacitor characteristics occur due to aging and fatigue phenomena. According to the aging characteristic, the polarization state magnitude of a ferroelectric capacitor gradually degrades over time. The magnitude also degrades by the fatigue phenomena as the number of polarization state changes increase as a result of writing the memory cell with different data.

In order to circumvent these problems with single-ended sensing of ferroelectric memory cells, complementary-type cell architectures have been developed which include a pair of ferroelectric capacitors and select transistors, where each ferroelectric capacitor is polarized to opposite states. A pair of bit lines is also employed with this type of cell architecture. When such a memory cell is read, the electrical charge discharged from the respective ferroelectric capacitors generates a different voltage on each bit line. The inputs of a differential sense amplifier can be connected to the pair of bit lines and differentially sense whether one bit line voltage is greater than the other, or vice versa, and thereby determine the polarization state of the pair of ferroelectric capacitors. With this scheme, each memory cell includes twice the number of components of a single-transistor, single-capacitor cell, and thus the density of the memory cells per chip is compromised.

From the foregoing, it can be seen that a need exists for a high density memory architecture utilizing single-transistor, single-capacitor ferroelectric cells and single-ended sensing, but where the reference voltage for the sensing circuits changes dynamically with the characteristics of the ferroelectric capacitors. An associated need exists for an improved reference circuit which generates a voltage corresponding to the instantaneous ferroelectric capacitor characteristics. Yet another associated need exists for a reference voltage generator that generates a voltage that tracks short-term and long-term changes in ferroelectric capacitor characteristics.

SUMMARY OF THE INVENTION

In accordance with the present invention, the disclosed dynamic reference circuit, and method of operation thereof, substantially reduce or eliminate the disadvantages and shortcomings associated with the prior art circuits and techniques. According to one aspect of the invention, a reference voltage is generated by discharging a reference ferroelectric capacitor having stored therein one polarization state and discharging another reference ferroelectric capacitor having stored therein a different polarization state. The electrical charges developed as a result of discharging the ferroelectric capacitors generate respective voltages across sensing capacitances, which voltages are representative of the polarization states. Then, the representative voltages are averaged, thereby developing a reference voltage having a value intermediate the readout of the polarization states of the capacitors. Importantly, the averaged voltage dynamically changes with the short-term and long-term characteristics of the ferroelectric reference capacitors. According to the preferred form of the invention, the two representative voltages are averaged by short circuiting the voltages together.

When such a reference circuit is employed in connection with a ferroelectric memory, the reference capacitors are addressed each time an associated data word is addressed, whereby the ferroelectric characteristics of the reference cell and thus the reference voltage, change according to the characteristics of the ferroelectric capacitors that store the associated data word. Hence, the preferred form of the invention incorporates a reference ferroelectric capacitor cell with each addressable data word.

In accordance with another form of the invention, a ferroelectric memory can be realized having an array of single-transistor, single-capacitor ferroelectric memory cells, and one or more two-transistor, two-capacitor reference cells for generating a reference voltage that dynamically changes with the changing characteristics thereof. With this arrangement, a reference cell may not be associated with each addressable data word, but yet provide a dynamic reference voltage that is the average of the read out of oppositely polarized ferroelectric capacitors. In this manner, fewer reference cells are utilized, thereby conserving semiconductor wafer area.

BRIEF DESCRIPTION OF THE DRAWINGS

Further features and advantages will become apparent from the following and more particular description of the preferred embodiment of the invention, as illustrated in the accompanying drawings in which like reference characters generally refer to the same components or elements throughout the views, and in which:

FIG. 5 illustrates in block diagram form a memory architecture according to the invention;

FIG. 7 is a set of waveforms illustrating the operation of the ferroelectric reference cell of the invention.

DETAILED DESCRIPTION OF THE INVENTION

Figure 1:
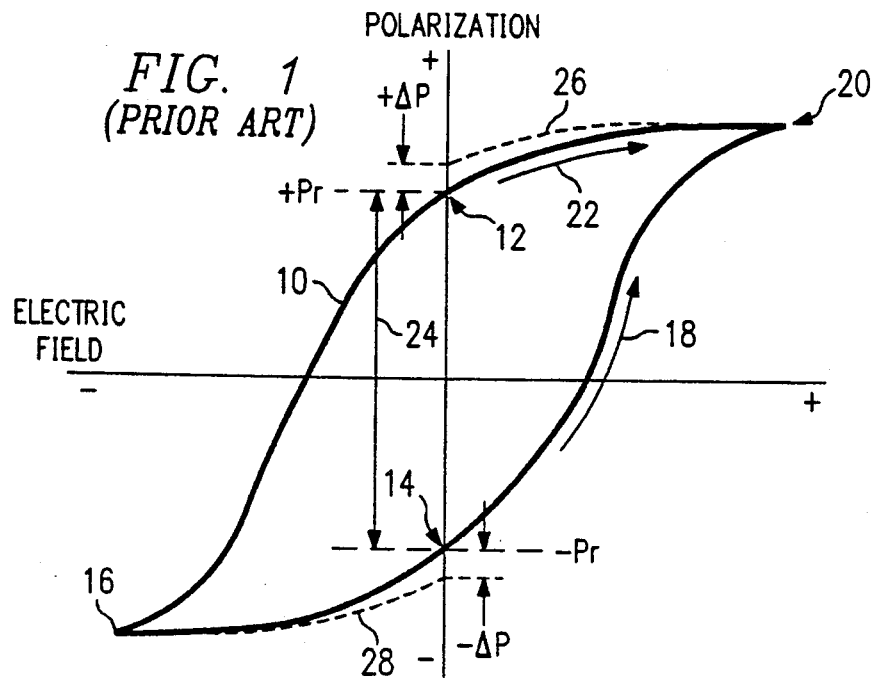
FIG. 1 is a hysteresis loop of a ferroelectric capacitor, illustrating the short-term changes in characteristics.

FIG. 1 illustrates the characteristics that enable a ferroelectric capacitor to store opposite polarization states. The horizontal coordinate of FIG. 1 illustrates the electric field applied between the plates of a ferroelectric capacitor, while the vertical coordinate illustrates the polarization magnitude of the ferroelectric material. The hysteresis loop itself, shown a reference numeral 10, is traversed through the change of a difference in voltage applied to the plates to the ferroelectric capacitor. A stable, positive polarization state ($+P_r$) is denoted by reference numeral 12, while a stable negative polarization state ($-P_r$) is denoted as reference numeral 14. These polarization states, only one of which can exist within the ferroelectric material at a time, remain in the absence of any voltage applied to the ferroelectric material. It is a remanent polarization that remains in the ferroelectric material once the material has been polarized and the polarization electric field removed.

When a negative voltage is applied to the plates of a ferroelectric capacitor, the hysteresis curve is traversed toward the lower, left point 16. After the electric field is reduced to zero, the material retains its negative polarization state of magnitude noted by numeral 14. If a ferroelectric capacitor so polarized is then subjected to a positive polarity electric field, then the hysteresis loop 10 is traversed along path 18 toward point 20. Again, once the electric field is reduced to zero, the material remains in a positive polarization state of magnitude noted by numeral 12. Importantly, the transition between points 14 and 20 represent a change in polarization from a negative state to a positive state. On the other hand, if the ferroelectric material has been initially polarized at a positive state ($+P_r$), and thereafter is subjected to a positive polarity field, the hysteresis loop 10 is traversed along path 22 to point 20, and then back to point 12 in a reversed direction. In this instance, the polarization state does not change when subjected to the positive polarity field. The difference in magnitude of the stable polarization states is noted by arrow 124.

While the foregoing illustrates the typical traversal of the hysteresis loop of a ferroelectric component, it should be noted that in practice, the loop is traversed in a slightly different route, as noted by broken lines 26 and 28. For example, broken line 26 illustrates the path taken long the hysteresis loop when the positive electric field applied across the capacitor is applied and then reduced to zero. The polarization magnitude at this time is $(+P_r)+(+\Delta P)$. Then, in matter of milliseconds, the polarization state fades to a lesser magnitude and returns to the stable magnitude $+P_r$ at point 12. It can be appreciated that if the ferroelectric component is accessed before the $+P_r$ polarization state is achieved, different instantaneous polarization magnitudes may exist, thus giving rise to the discharge of different electrical charges. This phenomenon also occurs during the application of a negative electric field, as noted by broken line 28. Thus, depending upon how quickly the ferroelectric component is reaccessed, the polarization state may be at different magnitudes. This type of change in polarization magnitude is termed a short-term variance.

Ferroelectric materials in general are also known to undergo changes in characteristics due to changes in temperature, time, age and the number of times accessed. The polarization magnitudes tend to decrease because of these long-term changes. As can be appreciated, and in view that the read out voltages of small ferroelectric capacitors are on the order of millivolts, the changes in ferroelectric characteristics due to short- or long-term changes can have a profound effect on the reliability of polarization determinations.

Figure 2:
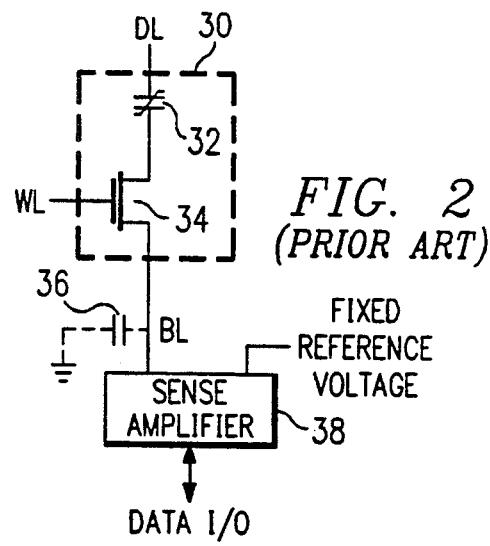
FIG. 2 illustrates a conventional single-transistor ferroelectric memory cell employing single-ended sensing.

FIG. 2 illustrates a well known single-ended sensing technique for determining the polarization state stored in a ferroelectric memory cell 30. The memory cell 30 is of a conventional type having a ferroelectric capacitor 32 and a select transistor 34. The ferroelectric capacitor 32 is connectable between a drive line (DL) and a bit line (BL) when the select transistor 34 is driven into conduction by a signal on the word line (WL). The bit line includes an inherent parasitic capacitance shown as reference numeral 36. The bit line is connected to a sense amplifier 38 which either converts bit line signals into corresponding digital signals for output on the I/O terminal, or drives the bit line with a desired digital state or write the ferroelectric capacitor 32 with a corresponding polarization state. It should be noted that when the ferroelectric capacitor 32 is written with a desired polarization state, the drive line (DL) and the bit line (BL) are driven so that the appropriate positive or negative electric field is applied across the ferroelectric capacitor plates and cause a corresponding polarization state to be stored.

Single-ended sensing is carried out according to the following. For purposes of example, when the ferroelectric capacitor 32 is read, the select transistor 34 is driven into conduction, a voltage is applied to the drive line (DL), whereupon an electrical charge is transferred to the bit line (BL) depending upon the polarization state. For purposes of example, a ferroelectric capacitor 32 can generate a 100 millivolt signal on the bit line for a zero polarization state, and can generate a 150 millivolt signal on the bit line when a one polarization state is read. Essentially, the parasitic capacitance 36 of the bit line is charged by the reading of the ferroelectric capacitor 32, thereby generating the bit line voltage.

With the foregoing bit line voltages, a fixed reference voltage of about 125 millivolts is supplied to the sense amplifier 38 for comparing with the bit line voltage to determine if a zero or one polarization state was previously stored in the ferroelectric capacitor 32. In other words, if during the sensing phase of the read operation the sense amplifier 38 found the bit line voltage to be greater than the fixed reference voltage, then a one polarization state was stored in the ferroelectric capacitor 32. On the other hand, if the sense amplifier 38 determines that the bit line voltage is less than the fixed reference voltage, than a zero polarization state was stored in the ferroelectric capacitor 32. As can be appreciated, if either the polarization state magnitudes of the ferroelectric capacitor 32 change due to short-term or long-term variances, and/or the reference voltage varies, then the probability of an error in sensing the polarization state increases.

Figure 3:
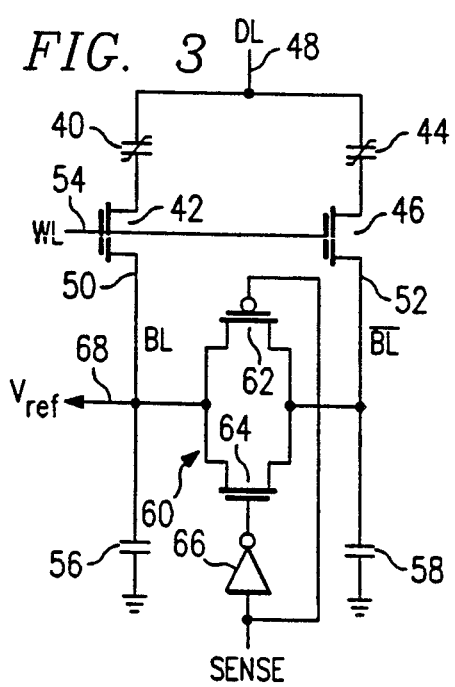
FIG. 3 illustrates a ferroelectric reference cell according to the invention.

With reference now to FIG. 3, there is illustrated a ferroelectric reference cell of the invention. The reference cell essentially comprises a complementary cell having a first reference ferroelectric capacitor 40 and associated select transistor 42, and a second reference ferroelectric capacitor 44 and an associated select transistor 46. Ferroelectric capacitors 40 and 44 are preferably the same size and are polarized with opposite polarization states with circuits not shown. One plate of each ferroelectric capacitor 40 and 44 is connected to a drive line 48, while each ferroelectric capacitor is connected by way of its associated select transistor to a different bit line 50 and 52. The bit lines 50 and 52 are illustrated as being of the complementary type, i.e., designated bit line and bit line bar. The select transistors 42 and 46 are driven by a common word line 54. The complementary bit lines 50 and 52 are connected to respective discrete or parasitic sense capacitances 56 and 58, which are also preferably the same size. One plate of each of the sense capacitances 56 and 58 is grounded. Further, a CMOS pass gate 60 is connected between the complementary bit lines 50 and 52 to provide a short circuit therebetween in response to a sense signal. The CMOS pass gate 60 includes a p-channel transistor 62 and an n-channel transistor 64 to provide a low resistance path between the bit lines 50 and 52. Further, the n-channel transistor 64 has a gate driven by way of an inverter 66, while the p-channel transistor 62 is driven by the sense signal itself.

In operation, the ferroelectric reference cell generates a reference voltage by applying a voltage to the word line 54 and then applying a voltage to the drive line 48. The ferroelectric capacitors 40 and 44, being coupled to the bit lines 50 and 52, will transfer or discharge an electrical charge thereto. When reading complementary polarized ferroelectric capacitors, one will switch polarization states while the other capacitor will remain in its initially polarized state. As a result, the sense capacitors 56 and 58 become charged to a voltage based upon the amount of electrical charge transferred from the capacitors 40 and 44 to the respective bit lines 50 and 52. Importantly, the ferroelectric capacitor polarized in a positive state will transfer less electrical charge to its associated bit line than the ferroelectric capacitor that switches state, i.e., the one initially polarized with a negative state. In any event, the sense capacitors 56 and 58 will be charged differently and thus will have different voltages thereacross. Before, during or after the application of the drive line signal, a sense signal is applied to the CMOS pass gate 60, thereby driving both transistors 62 and 64 into conduction and applying a short circuit between the bit lines 50 and 52. The charge on the sense capacitors 56 and 58 equalizes and a reference voltage is then established at the $V_{ref}$ output 68. Importantly, the reference voltage is exactly midway between the magnitude of the voltage on one sense capacitor and the magnitude of the voltage on the other capacitor, if such capacitors are of substantially equal value. The sense signal is applied to the reference cell for as long as the output reference voltage is required. While not shown in FIG. 3, the drive line signal (DL) is applied to the reference cell in correspondence with its application to the associated single-transistor memory cells in the array.

Figure 4:
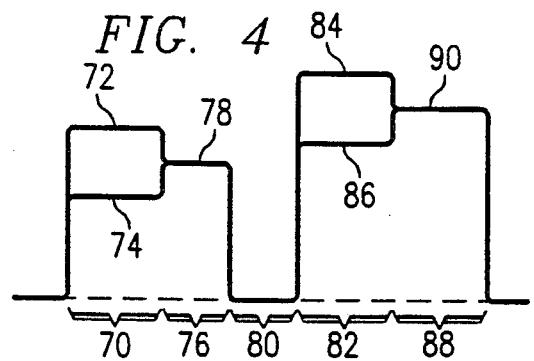
FIG. 4 depicts electrical waveforms illustrating the dynamic characteristics of the reference cell of the invention.

FIG. 4 illustrates the dynamic nature of the reference voltage, in that it changes in correspondence with the changes of the characteristics of the ferroelectric capacitors 40 and 44 of the ferroelectric reference cell. Particularly, FIG. 4 illustrates two successive cycles of the generation of the reference voltage based upon short-term changes in the ferroelectric characteristics. During the first time period 70 word line and drive line signals are applied to the reference cell. Assuming ferroelectric capacitor 40 initially stores a negative polarization state, the capacitor switches polarization states and a voltage 72 is developed across the sense capacitor 56. For purposes of example, the magnitude of the capacitor read out voltages 72 and 74 are shown to be significantly different, but in practice may be of lesser or even greater magnitudes. Because ferroelectric capacitor 44 stores a positive polarization state, no polarization reversal occurs, and thus a smaller voltage 74 is developed across the sense capacitor 58. During this time, the CMOS pass gate 60 is assumed nonconductive, but becomes conductive during the sensing time period 76. During this time period, the sense signal is applied to the CMOS pass gate 60, thereby short circuiting the bit lines 50 and 52 and generating the intermediate reference voltage 78. It is during time period 76 that the reference voltage can be generated for use in determining the polarization states of other ferroelectric components. Alternatively, the CMOS pass gate 60 can be driven into conduction during time period 70 also. During time period 80, the bit lines 50 and 52 are discharged by other circuits not shown, and the ferroelectric capacitors 40 and 44 are rewritten with opposite polarization states, also with circuits not shown.

As noted above, if the ferroelectric capacitors 40 and 44 are immediately read before the polarization state magnitudes have settled, due to the short-term variances as noted in FIG. 1, the polarization magnitudes will be somewhat greater. This is noted in FIG. 4 during time period 82 where the word line and drive line signals are again applied to the reference cell to discharge the ferroelectric capacitors 40 and 44. This time, the voltages developed across the sense capacitors 56 and 58 are of greater magnitude than that occurring during the immediately preceding cell operation. The increased sense capacitor voltages are illustrated as numerals 84 and 86. During time period 88, the sense signal is again applied to the CMOS pass gate 60 to short circuit the bit lines 50 and 52 and thereby generate a reference voltage 90 that is exactly intermediate the voltages 84 and 86. It is to be noted that the reference voltages 78 and 90 are of different magnitudes and track the characteristics of the ferroelectric capacitors 40 and 44 that have changed during to the two cell operations. While FIG. 4 illustrates the dynamic characteristics of the reference voltage for short-term changes, the same tracking occurs for long-term changes in the characteristics of the ferroelectric material.

While the foregoing illustrates a reference ferroelectric cell generating a dynamic reference voltage, other circuit alternatives are available. For example, instead of discharging the oppositely-polarized ferroelectric capacitors at the same time, a single ferroelectric capacitor could be polarized in one state, discharged to a first sense capacitor, and then polarized in a different state and then discharged into a second sense capacitor. As with the foregoing, the sense capacitors can then be short circuited together to generate an average voltage for the reference signal. While the alternative embodiment may require less semiconductor area for fabrication, it requires sequential operation and thus a longer operational period for generating a reference voltage.

FIG. 5 illustrates a memory architecture employing the principles and concepts of the invention. The ferroelectric memory includes one or more arrays 100, 101 of single-transistor, single-capacitor cells. By utilizing single-transistor type of ferroelectric cells, a high density memory is realized. Preferably, each memory array 100 and 101 is eight, sixteen, thirty-two ... etc. bits wide where each bit of an array in a horizontal row is accessed together as a multiple bit word. A drive line decoder 102 operates in conjunction with a word line decoder 104 to access a single row of cells in either array 100 or array 101. In the exemplary memory, the word line decoder 104 has word lines extending along rows common to the arrays 100 and 101, but the drive line decoder 102 accesses only array 100, or array 101, depending on which array has stored therein the data corresponding to a memory address. The drive line decoder 102 and the word line decoder 104 are also connected to reference cell arrays 106 and 107 to generate a reference voltage each time array 100 or array 101 is accessed. Preferably, although not necessary, the reference cell arrays 106 and 107 each include a single column of reference cells, each cell being similar to that shown in FIG. 3, but with one such reference cell for each addressable data word of the memory arrays 100 and 101. In this manner, the ferroelectric capacitors of each memory array row, and those associated with the reference cell row, are subjected to the same access cycles, timing, etc. and thus track in short-term and long-term characteristics. The reference cells of the arrays 106 and 107 are connected to provide a dynamic reference voltage on a common output 68. A number of sense amplifiers 110 receive the dynamic reference voltage generated on the reference line 68. Preferably, there is one sense amplifier associated with a column in both memory arrays 100 and 101. In order to accomplish this, the bit lines of the arrays 100 and 101 can be multiplexed with cross-point logic or other circuits to a common set of sense amplifiers 110. Data is input and output to the memory arrays 100 and 101 by way of the sense amplifiers 110.

Figure 6:
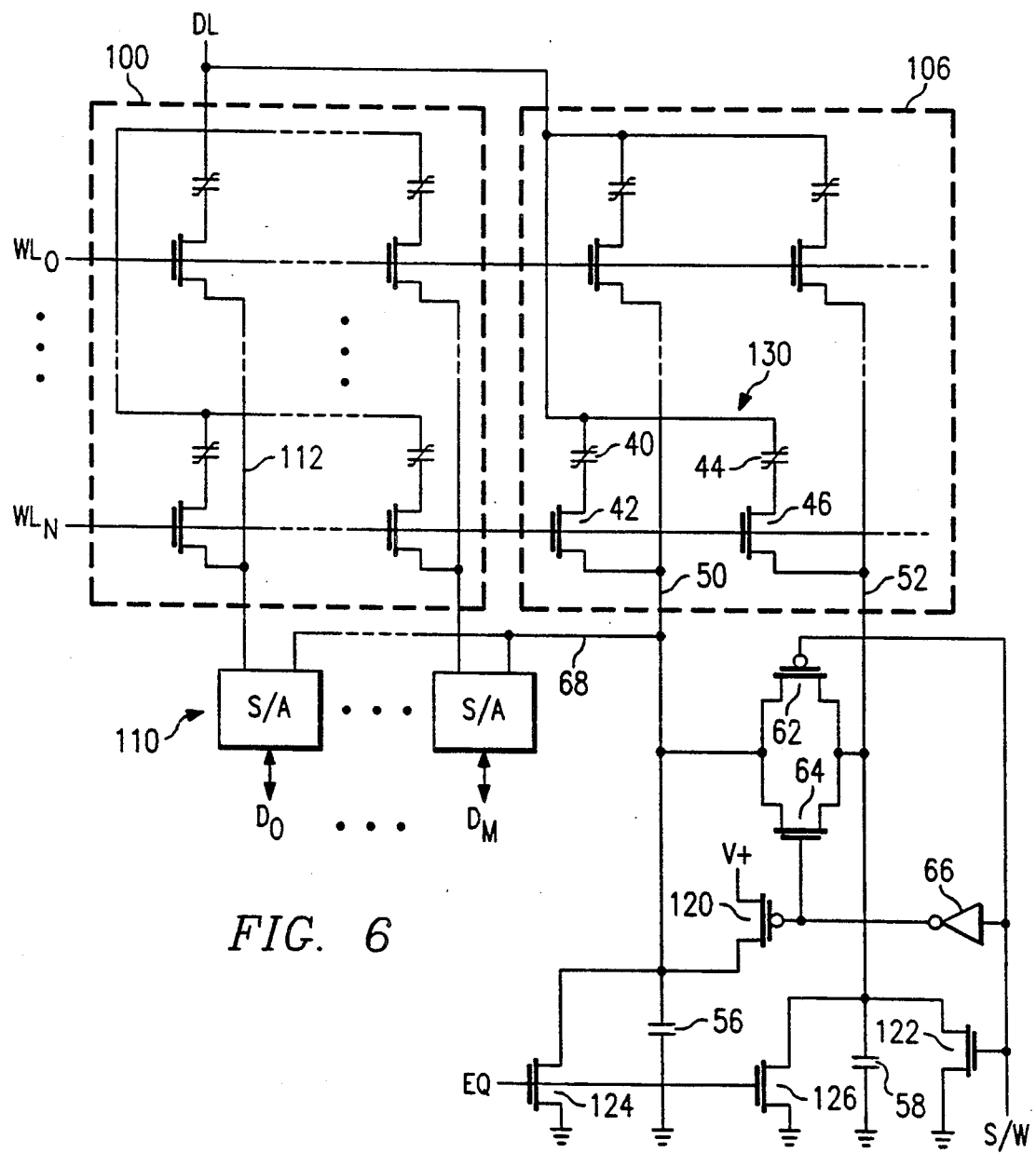
FIG. 6 is a detailed schematic diagram of the memory array architecture of FIG. 5.

FIG. 6 illustrates in more detail the memory array 100 and the reference cell array 106 of FIG. 5. Memory array 101 and reference array 107 are similarly constructed. As noted, for each addressable data word of array 100 driven by a word line, there is a corresponding reference cell having ferroelectric capacitors polarized with opposite states. Hence, in the preferred form of the invention, for each independently addressable data word, there is a corresponding dynamic reference cell. The number of addressable rows or data words in the array 100 can be any convenient number, depending upon the amount of memory space required. The number of columns can also be any number of bits, but preferably correspond to multiples of bits comprising one or more bytes. In the exemplary array of FIG. 6, there are M number of columns, each uniquely associated with a sense amplifier 110. Each sense amplifier can typically be of a conventional SRAM or DRAM type having a pair of inputs for differentially sensing two signals. On one input of each sense amplifier there is connected a bit line, such as 112, that extends throughout the column of the memory array 100. The other input of the sense amplifier is connected to the reference voltage line 68 to receive a reference voltage generated by the particular reference cell associated with the memory row accessed.

The reference cell array 106 includes the circuitry described above in connection with FIG. 3, in addition to other circuits. For example, transistors 120 and 122 are driven in response to the sense signal during time period 80 (FIG. 4) to drive the bit lines 50 and 52 to opposite digital states for writing the ferroelectric capacitors of the reference cell array 106 to opposite polarization states. Transistors 124 and 126 are also connected between the respective bit lines 50 and 52, and ground, to discharge the bit lines subsequent to rewrite time periods of the reference cell array, but before a read operation. The transistors 124 and 126 are driven by an equalization signal.

FIG. 7 is illustrative of the waveforms applied to the memory for controlling the various operations thereof. For example, the drive line (DL) waveform is applied to a decoded one of the drive lines noted in FIG. 5. The word line (WL) signal is applied to a selected one of the word lines ($WL_O-WL_N$) during the read, write and writeback cycles. A sense/writeback (S/W) signal is applied to the reference cell array 106 to achieve both sensing by the sense amplifiers 110, as well as writeback of the polarization states in the ferroelectric capacitors of the reference cell array 106. The sense/writeback (S/W) signal is maintained in the sense mode whenever the associated data word is not being written. The equalization (EQ) signal is also applied to the reference cell array 106 to discharge the bit lines in preparation of a new memory cycle.

The operation of the memory circuit of FIG. 6, in conjunction with that of FIG. 7, is as follows. The sequence of the waveforms illustrate a read operation, a writeback operation and a subsequent write operation. Prior to a memory access, the equalization signal (EQ) is driven high to turn on transistors 124 and 126 to discharge the bit lines of the reference memory array 106. The equalization signal also discharges the bit lines of the memory array 100. The sense/writeback signal is also low at this time, as well as during the read operation, to drive the pass gate transistors 62 and 64 into conduction. If an address is applied to the ferroelectric memory of the invention such that word line ($WL_N$) is accessed, then the entire horizontal row N of M memory cells is simultaneously accessed, as well as reference cell 130. The word line signal drives the transistors of the Nth row of cells into conduction, thereby coupling the corresponding ferroelectric capacitors between the drive line (DL) and the respective bit lines. Thereafter, the drive line signal (DL) is driven to a high level, preferably a digital logic level, thereby transferring charge from the ferroelectric capacitors of the accessed memory array row to the respective bit lines. Again, the charge transferred is dependent upon the polarization state previously stored in the respective ferroelectric capacitors. As noted in FIG. 7, the bit lines 50 and 52 of the reference cell array 106 are also driven to representative voltages, depending upon which reference ferroelectric capacitor 40 or 44 is in a one or zero state. The bit lines of the memory array 100 are also driven to representative voltages by the array capacitors and coupled to the respective sense amplifiers 110. As further noted in FIG. 7, the equalization (EQ) waveform is low during the read cycle, thereby maintaining transistors 124 and 126 in a nonconductive state. As noted above, the sense/writeback signal is also maintained at a digital low level during the read operation to maintain CMOS pass gate transistors 62 and 64 in a conductive state, thereby averaging the transferred charge on the parasitic bit line capacitances 56 and 58. This action functions to mathematically average the representative voltages on the bit lines 50 and 52 to the same intermediate level, as noted in the waveforms. The dynamically adjusted reference voltage is then presented on reference line 68 to each of the sense amplifiers 110. While not shown, the sense amplifiers 110 are then enabled to sense the polarization state of the accessed cells in the memory array 100. The data outputs of the sense amplifiers 110 will then be driven to digital states corresponding to the polarization state of each accessed cell in the respective array columns.

Having read the ferroelectric memory of the invention, the switched polarization states of those ferroelectric capacitors in the accessed cells of the memory array 100 are restored, or written back, as are the ferroelectric capacitors 40 and 44 in the reference cell array 106. The writeback sequence shown in FIG. 7 is initiated when the S/W signal goes to a logic high level. This transition of the S/W signal places the pass gate transistors 62 and 64 in a nonconductive state, and drives transistors 120 and 122 into conduction. Transistor 120 applies to a high logic state to bit line 50, while transistor 122 applies to low logic state to bit line 52. The bit lines 50 and 52 are thus held at opposite digital states during the rewrite operation. With the word line signal yet at a high level, the reference ferroelectric capacitors 40 and 44 are connected between the drive line 48 and the respective bit lines 50 and 52. When the drive line 48 is at its high state, one polarization state is stored in ferroelectric capacitor 44 as bit line 52 is at a low logic state. When the drive line voltage transcends to a low state, ferroelectric capacitor 40 is polarized in an opposite state, as its associated bit line 50 is at a logic high state. Because transistors 120 and 122 are connected respectively to power and ground to hold the bit lines 50 and 52 to opposite states, the ferroelectric capacitors 40 and 44 are always restored to the same previous polarization state. Those skilled in the art can readily devise of flip-flop or other circuits for causing the ferroelectric capacitors 40 and 44 to alternate between polarization states during successive rewrite operations.

A write sequence is also shown by the waveforms of FIG. 7. Since the drive lines and word lines of the memory array 100 and the reference cell array 106 are connected in common, a write of the memory array 100 also causes a write of the reference array 106. Prior to the write operation, the bit lines 50 and 52 are equalized so as to discharge any voltage thereon. The sense/writeback signal is then driven high to drive the reference array bit lines to opposite states. With the drive line 48 high and one bit line low, one reference ferroelectric capacitor will be polarized in one direction. Then, the drive line signal is brought to a low level to polarize the other reference ferroelectric capacitor to the other polarization state. The writing of the cells of the memory array 100 are carried out in the manner noted above, but by inputting a logic signal to the sense amplifiers 110 to drive the single bit lines to desired states to polarize the ferroelectric capacitors to desired states.

While the preferred and other embodiments of the invention have been disclosed with reference to specific ferroelectric memory circuits and methods of operation thereof, it is to be understood that changes in detail may be made as a matter of engineering choices, without departing from the spirit and scope of the invention, as defined by the appended claims. For instance, it can be appreciated that reference cells and memory arrays can be fabricated using bipolar, rather than field effect transistors. Also, the invention can be implemented in transistor-capacitor memory systems of the type using capacitive storage elements other than ferroelectric capacitors.

What is claimed is:

1. A reference circuit for generating a reference voltage for use with ferroelectric memory circuits, comprising:
   a first and second sense capacitances;
   a first ferroelectric capacitor and a first select transistor connected so that when selected by a signal, said first ferroelectric capacitor is connected in series with said first sense capacitance;
   a second ferroelectric capacitor and a second select transistor connected so that when selected by a signal, said second ferroelectric capacitor is connected in series with said second sense capacitance; and
   a circuit for short circuiting a junction between said first ferroelectric capacitor and said first sense capacitance to a junction between said second ferroelectric capacitor and said second sense capacitance, a voltage at said short circuited junction defining said reference voltage.

2. The reference circuit of claim 1, wherein said select transistors comprise field effect transistors, each having a gate terminal connected together for simultaneous selection.

3. The reference circuit of claim 1, further including a pair of bit lines, each bit line connected to a different said ferroelectric capacitor via a respective said select transistor.

4. The reference circuit of claim 1, wherein each said ferroelectric capacitor includes spaced-apart plates with a ferroelectric material therebetween, and wherein one said plate of each said ferroelectric capacitor is connected together.

5. The reference circuit of claim 1, wherein said circuit for short circuiting said junctions comprises at least one transistor.

6. The reference circuit of claim 1, wherein said circuit for short circuiting comprises a CMOS pass gate transistor pair.

7. The reference circuit of claim 1, further including means for writing each said ferroelectric capacitor with a different polarization state.

8. A reference circuit for use with a ferroelectric memory, comprising:
   a pair of sense capacitances;

a complementary cell defined by a pair of select transistors and a ferroelectric capacitor associated with each said transistor, each said select transistor being effective to connect one said ferroelectric capacitor in series with one said sense capacitance so that an amount of electrical charge read from a respective ferroelectric capacitor is transferred to said sense capacitance in proportion to a polarization state stored in the respective ferroelectric capacitors; and a circuit for generating an average voltage of the voltage across the sense capacitances, said average voltage defining said reference voltage.

9. The reference circuit of claim 8, further including means for storing different polarization states in each said ferroelectric capacitor.

10. The reference circuit of claim 8, further including in combination a ferroelectric memory array comprising rows and columns of memory cells, and one said reference circuit for each addressable row.

11. A method for generating a reference voltage for a ferroelectric memory circuit, comprising the steps of:
   storing opposite polarization states in a pair of ferroelectric capacitors;
   discharging the charge of each said ferroelectric capacitor into a respective sense capacitance so that said sense capacitances are charged to a corresponding voltage; and
   averaging the voltage of each sense capacitance to provide a reference voltage midway between the corresponding voltages to which said sense capacitances are charged.

12. The method of claim 11, further including carrying out the averaging step by short circuiting one plate of each said sense capacitance together.

13. The method of claim 11, further including restoring opposite polarization states in the respective ferroelectric capacitors after each said averaging step.

14. The method of claim 13, further including carrying out the restoring step by driving one plate of each said ferroelectric capacitor to opposite voltage states.

15. A ferroelectric memory, comprising:
   an array of ferroelectric memory cells, each cell having a single select transistor and a single ferroelectric capacitor connected between a drive line and a bit line by said select transistor, said array comprising plural rows and plural columns of said cells;
   a sense amplifier connected to each said bit line;
   for each row of cells of said array, an associated reference cell defined by a pair of select transistors and a pair of ferroelectric capacitors polarizable in opposite states, each said ferroelectric capacitor of each said reference cell being connectable to a different bit line of the reference cell, wherein when each row of the array of ferroelectric memory cells is accessed, a corresponding reference cell is also accessed;
   a sense capacitance associated with each bit line of each reference cell;
   means for short circuiting together the bit lines of each reference cell to obtain an average voltage developed across the sense capacitances; and
   a conductor for coupling the average voltage to each said sense amplifier.

16. The ferroelectric memory of claim 15, wherein each row of the memory array has multiple bits that are read during an access cycle.

17. The ferroelectric memory of claim 15, further including means for polarizing the ferroelectric capacitors of each said reference cell to opposite states.

18. The ferroelectric memory of claim 15, wherein each reference cell is connected in common to a pair of bit lines.

19. The ferroelectric memory of claim 15, further including a memory word line connected to a row of select transistors of the memory array and connected to the select transistors of a reference cell, and a drive line connected in common to memory cells of the array and to at least one reference cell.

20. A method of operating a ferroelectric memory, comprising the steps of:
   accessing a memory cell so that a ferroelectric capacitor is connected between a drive line and a bit line by a select transistor, said accessing causing a charge to be transferred from a ferroelectric capacitor to said bit line to develop a bit line voltage proportional to a polarization state stored in the ferroelectric capacitor;
   discharging a first reference ferroelectric capacitor storing a polarization state to develop a first voltage corresponding to the polarization state of the first reference ferroelectric capacitor;
   discharging a second reference ferroelectric capacitor storing an opposite polarization state to develop a second voltage corresponding to the polarization state of the second reference ferroelectric capacitor;
   averaging said first and second voltages; and
   comparing the bit line voltage of said memory cell with the average voltage to define the polarization state stored in the ferroelectric capacitor of the memory cell.

21. The method of claim 20, wherein said memory comprises multiple row and columns of said memory cells, and further including discharging different said first and second reference ferroelectric capacitors for each row of cells accessed to develop a respective reference voltage for each said row of memory cells.

22. The method of claim 20, further including restoring opposite polarization states in each said first and second reference ferroelectric capacitors after each said accessing step.

23. The method of claim 20, further including carrying out the averaging step by short circuiting the first and second voltages together.

24. A method for generating a reference voltage for use in determining polarization states in a ferroelectric circuit, comprising the steps of:
   polarizing a ferroelectric capacitor to one polarization state;
   polarizing a ferroelectric capacitor to a different polarization state;
   discharging the ferroelectric capacitor having stored therein the one polarization state to obtain a voltage representative of the first polarization state;
   discharging the ferroelectric capacitor having stored therein the different polarization state to obtain a voltage representative of the different polarization state; and
   deriving an average voltage of the voltages representative of the polarization states, said average defining the reference voltage.

25. The method of claim 24, further including simultaneously polarizing different said ferroelectric capacitors, each with a different polarization state.

26. The method of claim 24, further including sequentially polarizing one ferroelectric capacitor to one polarization state and thereafter polarizing the other ferroelectric capacitor to the different polarization state.

27. The method of claim 24, wherein said deriving step is carried out by short circuiting the representative voltages together to achieve said average voltage.

28. The method of claim 24, further including discharging the ferroelectric capacitor with the one polarization state to a first series-connected capacitor, and discharging the ferroelectric capacitor with the different polarization state to a second series-connected capacitor.

29. The method of claim 28, further including shorting a plate of each said series-connected capacitor together to derive the average of the representative voltages.

30. The method of claim 29, further including shorting the series-connected capacitors by driving a transistor connected to each said series-connected capacitor into conduction.

* * * * *